United States Patent [19]
Kennedy, Jr. et al.

[11] 4,087,745
[45] May 2, 1978

[54] TECHNIQUE FOR CONTACTLESS CHARACTERIZATION OF SEMICONDUCTING MATERIAL AND DEVICE STRUCTURES

[75] Inventors: Thomas A. Kennedy, Jr., Oxon Hill, Md.; Bruce D. McCombe, Alexandria, Va.

[73] Assignee: The United States of America as represented by the Secretary of the Navy, Washington, D.C.

[21] Appl. No.: 819,928

[22] Filed: Jul. 28, 1977

[51] Int. Cl.² ............................................. G01R 27/04
[52] U.S. Cl. .................................................. 324/58 B
[58] Field of Search .............. 324/58 B, 58 A, 58.5 A, 324/58.5 B, 58 R, 71 SN, 158 R

[56] References Cited

U.S. PATENT DOCUMENTS

| | | | |
|---|---|---|---|
| 2,644,930 | 7/1953 | Luhrs et al. | 324/58.5 A |
| 2,714,663 | 8/1955 | Norton | 324/58.5 A X |
| 3,090,003 | 5/1963 | Rempel et al. | 324/58.5 B X |

Primary Examiner—Stanley T. Krawczewicz
Attorney, Agent, or Firm—R. S. Sciascia; Philip Schneider; Melvin L. Crane

[57] ABSTRACT

This invention is directed to a device and method for measuring carrier mobility and density in thin-film semiconductor materials such as those used in thin-film circuitry, particularly in high-frequency microwave devices. The device includes a microwave system in combination with a variable magnetic field in which the material to be measured is positioned at an E-field maximum in a shorted section of waveguide, which shorted section is in the magnetic field. The magnetic-field dependence of the reflected power is then monitored. The carrier mobility is derived from the value of the magnetic field at the point at which the microwave power reflected from the material falls to one-half of the reflected microwave power when the magnetic field value is zero. The electron density may be determined from the change in amplitude of the signal between zero magnetic field and high fields by proper calibration.

9 Claims, 2 Drawing Figures

TECHNIQUE FOR CONTACTLESS CHARACTERIZATION OF SEMICONDUCTING MATERIAL AND DEVICE STRUCTURES

BACKGROUND OF THE INVENTION

This invention relates to measurement of carrier mobility and density in semiconductor materials and more particularly to contactless measurements without any deleterious effects on the material.

It is well-known in the art that many semiconductor devices are made of different materials and with different thickness of layers which may be as thin as 25-50 Angstrons with current molecular-beam epitaxial technology. Such thin structures make it very difficult to measure different electrical characteristics. Thin layers are not conducive to connecting electrical contacts thereto because of the probability of damage to and for modification of the surface.

Heretofore measurements have been made by electrically contacting the layer in a semiconductor and making Hall and resistivity measurements. Analysis of the obtained data yields the electron concentration and the Hall mobility. Making ohmic contact is difficult, time-consuming, and destructive since a portion of the layer to be measured must be modified in making the contact. Making measurements of ion-implanted layers is particularly difficult, since annealing of induced damage must be carried out. For compound semiconductors, the sample must be encapsulated prior to the annealing state in order to prevent vaporization of any of the constituents. In this case, conventional Hall and resistivity measurements cannot be carried out unless the encapsulant has been stripped off. This requires additional time and effort and makes any study of annealing behavior extremely difficult and time-consuming.

This invention overcomes the disadvantages of the prior methods because the measurement is contact-free and requires no connections or modifications to the semiconductor structure during measurement.

SUMMARY OF THE INVENTION

A semiconductor element is placed in a shorted waveguide in a variable magnetic field with the magnetic field perpendicular to the E-field. The shorting element is adjusted axially within the waveguide until the semiconductor is at the E-field maximum. A circulator or magic-Tee is used to direct microwave power into the waveguide in which the semiconductor element is positioned and the reflected microwave power is directed to a detector. The detector output is representative of the microwave power it receives. The D.C. output of the detector, corresponding to various magnetic-field values from zero to the maximum, is recorded and a graph is made. A line from the midpoint of the vertical scale (the half power point) is drawn to the curve and the corresponding reading of the magnetic field is taken. The value of the magnetic field is substituted into a simple carrier mobility formula to determine the carrier mobility of the semiconductor element.

Alternatively, the D.C. output of the detector can be fed to a mini-computer programmed to solve the formula and the carrier mobility can be printed out directly by the computer.

The carrier density can be determined in a similar manner from the total change in the D.C. output of the detector between its zero and maximum magnetic-field values by proper calibration with a known sample of the same geometrical configuration.

The system and method enables one to determine the carrier mobility and density of a semiconductor element without connecting anything to the semiconductor element.

DETAILED DESCRIPTION OF THE INVENTION

Figure 1:
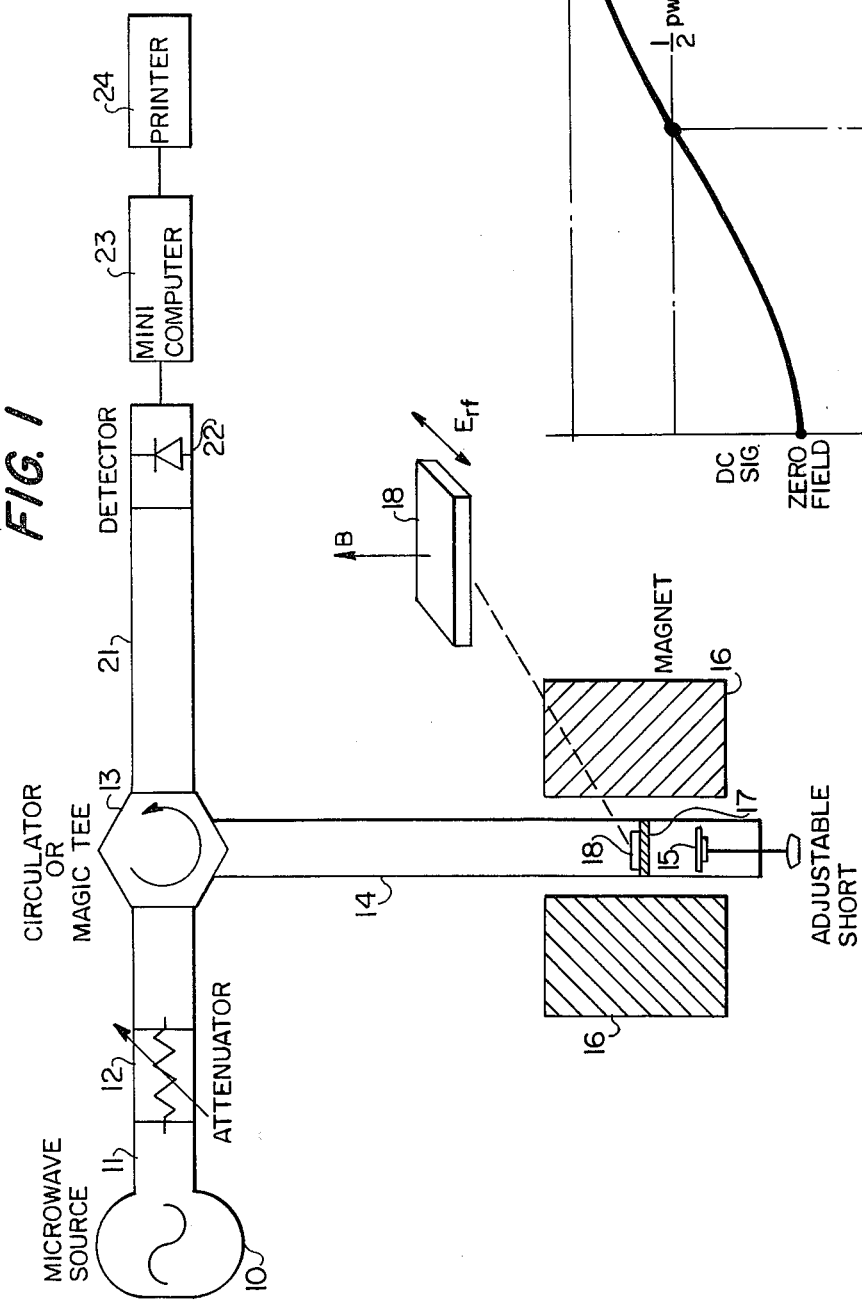
FIG. 1 illustrates a system for carrying out the invention.

A system useful for carrying out the method of this invention is shown in FIG. 1. The system includes a microwave source 10 of any desired type which is connected to a waveguide 11 that includes a variable attenuator 12 therein for varying the microwave power. The waveguide 11 connects with a microwave circulator or Magic Tee 13 which directs a portion of the incident microwave power into a waveguide 14. The waveguide 14 is shorted by shorting element 15 inserted into the waveguide near its end which is adjustable axially along the waveguide 14 to control the vertical position of the maximum microwave electric field.

An adjustable magnet 16 is positioned in the area of the shorted waveguide end to produce a variable-strength magnetic field within the waveguide in the axial direction from zero to a desired maximum value. A support means 17, which does not have any effect on the microwave power, is positioned above the shorting means within the waveguide such that a semiconductor element 18 to be measured may be positioned on the support means and the microwave power adjusted so that the semiconductor element is at an E-field maximum within the waveguide. In this position, the sample is ¼ of a wavelength from the shorted end of the waveguide, the magnetic field is applied in the Z-axis direction of the semiconductor, perpendicular to the large surface of the semiconductor element, but parallel to the longitudinal axis of the waveguide, and the E-field direction is perpendicular to the magnetic-field direction.

The microwave power not absorbed by the semiconductor element is reflected back along the waveguide 14 to the circulator or magic Tee 13 and directed by the circulator or magic Tee along waveguide 21 to a receiver-detector 22. The receiver-detector has a D.C. output which is indicative of the microwave power reflected from the shorting element and not absorbed by the semiconductor element.

It has been determined that for semiconductors when the microwave frequency is sufficiently low and the Drude model for free carriers is valid, the field dependence of the absorbed power is governed by the Drude expression for the conductivity of carriers at zero frequency:

$$\sigma \approx \sigma_0 \left( \frac{1}{1 + \mu^2 B^2} \right)$$

where $\sigma$ is the material electrical conductivity; $\mu$ is the carrier mobility; $\sigma_0 = ne\mu$ which is the conductivity at zero magnetic field which is proportional to the carrier density where $n$ = the electron density, $e$ is the electron charge, and B is the magnetic field. Rapid data analysis is possible since at the field position $\sigma = \frac{1}{2}\sigma_0$, $\mu B = 1$, and $\mu = B^{-1}$, where MKS units are used and B is taken at the half-power point on the curve.

The output of the receiver detector may be directed into a mini-computer 23 programed to solve the above formula for carrier mobility and the carrier mobility value may be printed out by a printer 24 connected with the output of the computer. Additionally the difference in detector output between zero-field and high-field ($\mu B >> 1$) values is proportional to $\sigma_0$ which is directly proportional to carrier density; Thus the carrier density may be obtained by proper calibration with a known sample and the mini-computer programmed to print out this value as will.

The scientific basis upon which the carrier mobility is obtained by the above method is described as follows:

It is well known that for a system of charged carriers with an energy-independent relaxation time, $\tau$, in the presence of a uniform external magnetic field, B, along the z-direction, the conductivity is a tensor which can be written:

$$\underset{\approx}{\sigma} = \begin{bmatrix} \sigma_{xx} & \sigma_{xy} & 0 \\ \sigma_{yx} & \sigma_{yy} & 0 \\ 0 & 0 & \sigma_{zz} \end{bmatrix}$$

where $$\sigma_{xx} = \sigma_{yy} = \frac{\sigma_0(1 + i\omega\tau)}{(1 + i\omega\tau)^2 + \omega_c^2\tau^2}$$

$$\sigma_{yx} = \sigma_{xy} = \frac{\sigma_0 \omega_c \tau}{(1 + i\omega\tau)^2 + \omega_c^2\tau^2}$$

$$\sigma_{zz} = \frac{\sigma_0}{1 + i\omega\tau};$$

and $$\sigma_0 = \frac{ne^2\tau}{m^*} = ne\mu$$

$$\omega_c = \frac{eB}{m^*}$$

where $e$ is the electron charge, $n$ is the electron density, $m^*$ is the effective mass, and $\mu$ is the carrier mobility. For a thin-disk geometry sample, whose surface normal is parallel to the applied magnetic field and where all sample dimensions are much less than the wavelength of the microwaves, depolarization effects can be neglected, and the power P, absorbed from the electromagnetic field due to the charge carriers can be written (provided the skin depth is much greater than the sample thickness)

$$P = \frac{1}{2}\text{Re}\,\underline{J} \cdot \underline{E}^*$$

where $$\underline{J} = \underset{\approx}{\sigma} \cdot \underline{E};$$

E is the electric field in the solid (E* is the complex conjugate), and Re denotes the real part.

For a linearly polarized electric field along the x-direction $$P \, \alpha \, \text{Re}\,(\sigma_{xx}),$$

or from the above $$P \, \alpha \, \text{Re}\left[\frac{\sigma_0(1 + i\omega\tau)}{(1 + i\omega\tau)^2 + \omega_c^2\tau^2}\right].$$

For $\omega\tau << 1$, this can be rewritten as $$P \, \alpha \, \frac{\sigma_0}{1 + (\mu B)^2}$$

which forms the basis for this technique as described above.

Figure 2:
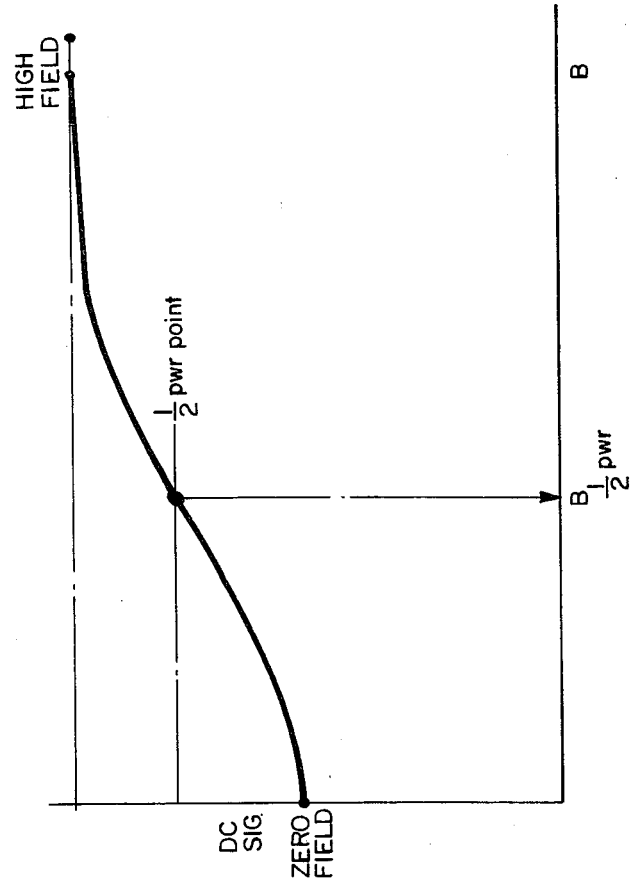
FIG. 2 illustrates a graph of the D.C. output vs magnetic field obtained during measurement of a semiconductor element.

In determining the carrier mobility and density, the semiconductor material is positioned within the waveguide 14 on the holder 17 and the shorting element is adjusted such that the semiconductor material is at the maximum E-field. Maximum E-field is determined by adjusting the shorting element axially within the end of the waveguide until the detector output is at minimum value with zero magnetic-field applied. With the magnetic field at zero, the D.C. output of the receiver detector is recorded. The magnetic field is then varied in steps to its maximum value and the D.C. output of the detector is recorded for each magnetic field value applied. Upon reaching the maximum magnetic field value, the data is displayed in a graphical representation with the D.C. output of the detector as the ordinate and the magnetic field as the abscissa. The magnetic-field value for the mid-point D.C. output value is determined. (A graph is illustrated in FIG. 2). The magnetic-field value obtained is substituted into the formula $\mu = B^{-1}$ to determine the carrier mobility. The carrier density is determined from the difference between the zero-field and high-field values of the DC output which is compared with a previously measured calibration sample as follows:

$$n_{test\ sample} = \frac{[ne\mu]_{calibration\ sample}}{e[\mu]_{test\ sample}}$$

$$= \frac{[\text{dc output}\,(B = 0) - \text{dc output}\,(B >> \frac{1}{\mu})]_{test\ sample}}{[\text{dc output}\,(B = 0) - \text{dc output}\,(B >> \frac{1}{\mu})]_{Calibration\ sample}}$$

where $[\mu]$ test sample is obtained as described above.

The dc signal value in the high field limit may be determined in the following way. The minicomputer is suitably programmed to take the difference between the value of the dc signal at the present magnetic field and the value of the dc signal at 90% of the present magnetic field. This difference is then divided by the difference between the present value of the dc signal and the value at zero magnetic field. When this ratio is less than 4%, the present value of signal is taken to be the value in the high field limit. This procedure leads to an underestimate of the magnetic field at the half power point of less than 4%, and thus an overestimate of the mobility of less than 4%, which can be easily corrected in the computer. More accurate values of mobility can be obtained by fitting the approximate expression for signal vs magnetic field to the pairs of data points with the mobility as the fitting parameter.

Both the mobility and carrier density can be directly printed out by the printout unit of a properly programmed mini-computer which utilizes the above formulas and into which are directed the series of values of dc output and magnetic field.

An an example, a suitable microwave power is from 1 to 10 m Watts with a magnetic field which is variable from zero to about 6 Tesla.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. Apparatus for determining carrier mobility and density in a semiconductor element which comprises:
   a waveguide;
   support means in said waveguide transparent to microwave power for supporting a semiconductor element;
   a shorting element in one end of said waveguide for reflecting incident microwave power directed into the opposite end of said waveguide back through said waveguide;
   magnetic field-producing means external to said waveguide, said support means, and said shorting element in said waveguide for producing a magnetic field along the axial direction of said waveguide;
   a microwave source for producing microwave power;
   means for directing microwave power from said source into said waveguide; and
   detector means for detecting and producing an output representative of the microwave power reflected back through said waveguide by said shorting element.

2. Apparatus for determining carrier mobility and density in a semiconductor element as claimed in claim 1 in which:
   said magnetic field is variable from zero field to a maximum value.

3. Aparatus as claimed in claim 2 which comprises;
   a mini-computer for receiving the output from said detector; and
   means for printing out data from said computer which indicates carrier mobility of semiconductor elements.

4. A method of determining the carrier mobility and density of a semiconductor element which comprises:
   positioning a semiconductor element within a waveguide with its Z-axis in the direction of the linear axis of said waveguide;
   applying a variable magnetic field to said semiconductor element along the Z-axis thereof;
   directing a microwave beam into said waveguide through said semiconductor element;
   adjusting the microwave beam at zero value of the magnetic field until said semiconductor element is located at an E-field maximum of said microwave beam;
   reflecting said microwave beam back through said waveguide to a beam monitor;
   varying the magnetic field value in steps from zero to maximum; and computing an electrical characteristic of the semiconductor material.

5. A method of determining the carrier mobility of a semiconductor as claimed in claim 4 which comprises:
   monitoring the power signal of the reflected microwave beam from zero magnetic fiel value to a maximum magnetic-field value;
   directing the monitored signal into a programed minicomputer whereby the carrier mobility will be printed out by the computer output.

6. A method of determining the carrier mobility of a semiconductor element as claimed in claim 4 which comprises:
   monitoring the power signal of the reflected microwave beam from zero magnetic field value to a maximum magnetic field value to determine magnetic field value at which the microwave power reflected through said semiconductor falls to one half the reflected power when the magnetic field is at zero value and determining the carrier mobility.

7. A method of determining the carrier mobility of a semiconductor as claimed in claim 6 which comprises:
   computing the carrier mobility by the formula $\mu = B_{1/2PWR}^{-1}$ where $\mu$ is the carrier mobility and $B_{1/2PWR}^{-1}$ is the measurement of the magnetic field value at which the microwave power absorbed by the semiconductor element falls to one-half the power absorbed at the zero value of the applied magnetic field.

8. A method of determining the density of a semiconductor element as claimed in claim 4 which comprises:
   monitoring the power signal of the reflected microwave beam from zero magnetic field value to a maximum magnetic field value and comparing the output signal with the signal of a known sample of the same geometrical configuration.

9. A method of determining the density of a semiconductor element as claimed in claim 4 which comprises:
   monitoring the power signal of the reflected microwave beam from zero magnetic field value to a maximum magnetic field value and;
   subtracting the output value at the maximum magnetic field value from the value at zero magnetic field and dividing the difference by that of a known calibration sample of the same geometrical configuration, according to the formula:

carrier density =

$$\frac{[\text{dc output}(B=0) - \text{dc output}(B\frac{1}{})]_{test\ sample}}{[\text{dc output}(B=0) 31\ \text{dc output}(B\frac{1}{})]_{calibration\ sample}}$$

* * * * *